US010779395B1

(12) United States Patent
Harrigan (10) Patent No.: US 10,779,395 B1
(45) Date of Patent: Sep. 15, 2020

(54) ELECTROMAGNETIC INTERFERENCE SHIELD WITH INTEGRATED DECOUPLING

(71) Applicant: Microsoft Technology Licensing, LLC, Redmond, WA (US)

(72) Inventor: Jason Allen Harrigan, Sultan, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/394,949

(22) Filed: Apr. 25, 2019

(51) Int. Cl.
*H05K 9/00* (2006.01)
*H05K 1/02* (2006.01)
*H05K 3/02* (2006.01)
*H03H 7/38* (2006.01)

(52) U.S. Cl.
CPC ............. *H05K 1/0218* (2013.01); *H03H 7/38* (2013.01); *H05K 3/02* (2013.01); *H05K 9/0024* (2013.01); *H05K 9/0037* (2013.01); *H05K 9/0039* (2013.01); *H05K 9/0066* (2013.01)

(58) Field of Classification Search
CPC .. H05K 9/0024; H05K 9/0039; H05K 9/0037; H05K 9/0066
See application file for complete search history.

(56) References Cited

U.S. PATENT DOCUMENTS

| | | | |
|---|---|---|---|
| 6,037,846 A * | 3/2000 | Oberhammer | H01R 13/7195 174/367 |
| 6,717,485 B2 | 4/2004 | Kolb et al. | |
| 7,130,434 B1 | 10/2006 | Grattan et al. | |
| 7,557,307 B2 | 7/2009 | Nishizawa et al. | |
| 7,772,046 B2 * | 8/2010 | Pagaila | H01L 23/29 257/E21.502 |
| 8,102,669 B2 * | 1/2012 | Lu | H05K 5/0091 361/782 |
| 8,241,067 B2 | 8/2012 | Girard, Jr. et al. | |

(Continued)

OTHER PUBLICATIONS

Islam, Tarikul, "Advanced Interfacing Techniques for the Capacitive Sensors", In Publications of Springer, Apr. 2017, pp. 73-109.

(Continued)

*Primary Examiner* — Hung V Ngo
(74) *Attorney, Agent, or Firm* — Alleman Hall Creasman & Tuttle LLP (57) ABSTRACT

An electronic assembly includes a printed circuit board (PCB) and an electromagnetic interference (EMI) shield. The PCB includes a plurality of electronic components and a plurality of electrically-conductive traces. The EMI shield is sized and shaped to form a perimeter around at least one of the plurality of electronic components on the PCB. The plurality of electrically-conductive traces cross the perimeter formed by the EMI shield. The EMI shield includes a plurality of decoupling, filtering, or matching components electrically connected between the EMI shield and the plurality of electrically-conductive traces such that the plurality of decoupling, filtering, or matching components are configured to shunt signal noise from the plurality of electrically-conductive traces. The EMI shield is electrically connected to the PCB via the plurality of decoupling, filtering, or matching components to encapsulate and electromagnetically isolate the plurality of electronic components.

20 Claims, 4 Drawing Sheets

(56) References Cited

U.S. PATENT DOCUMENTS

| | | | |
|---|---|---|---|
| 9,124,009 B2 | 9/2015 | Atkinson et al. | |
| 9,510,452 B2 * | 11/2016 | Yumi | H05K 1/181 |
| 9,999,121 B2 * | 6/2018 | Khorrami | H01L 23/642 |
| 2017/0245404 A1 | 8/2017 | Koep et al. | |

OTHER PUBLICATIONS

Zhang, et al., "Design of Components and Circuits Underneath Integrated Inductors", In IEEE Journal of Solid-State Circuits, vol. 41, No. 10, Oct. 2006, pp. 2265-2271.

* cited by examiner

ELECTROMAGNETIC INTERFERENCE SHIELD WITH INTEGRATED DECOUPLING

BACKGROUND

Electromagnetic (EM) radiation may be emitted from various electronic sources. Such EM radiation can prevent electronic devices from functioning properly due to electromagnetic interference (EMI). In order to protect against EMI, an EMI shield may be electrically connected to a printed circuit board (PCB) to block EM radiation. In some examples, an electronic component on a PCB may be a source of EM radiation, and the EMI shield may be configured to encapsulate the electronic component to contain the EM radiation at the source. In other examples, an electronic component on a PCB may be susceptible to EMI, and the EMI shield may be configured to encapsulate the electronic component to block EM radiation from reaching the electronic component.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

An electronic assembly includes a printed circuit board (PCB) and an electromagnetic interference (EMI) shield. The PCB includes a plurality of electronic components and a plurality of electrically-conductive traces. The EMI shield is sized and shaped to form a perimeter around at least one of the plurality of electronic components on the PCB. The plurality of electrically-conductive traces and/or power planes cross the perimeter formed by the EMI shield. The EMI shield includes a plurality of decoupling, filtering, or matching components electrically connected between the EMI shield and the plurality of electrically-conductive traces and/or power planes such that the plurality of decoupling, filtering, or matching components are configured to filter or match signals or shunt noise from the plurality of electrically-conductive traces and/or power planes. The EMI shield is electrically connected to the PCB via the plurality of decoupling, filtering, or matching components to encapsulate and electromagnetically isolate the plurality of electronic components.

DETAILED DESCRIPTION

A conventional electromagnetic interference (EMI) shield may be electrically connected to a printed circuit board (PCB) to provide EMI shielding for at least some electric components on the PCB. In some examples, the PCB may require a continuously exposed ground plane around the perimeter of the PCB in order to facilitate an electrical connection with a conventional EMI shield that enables the EMI shield to provide effective EMI shielding for all of the electronic components. Such an electrical arrangement may result in an increase in size of such a PCB. As one example, a surface/footprint of the PCB may be increased to accommodate the continuously exposed ground plane surrounding the electronic components. As another example, layer count of the PCB may be increased to allow for additional layers (e.g., ground/power planes, additional vias) that enable electrical components to be more densely positioned on the surface of the PCB within a perimeter of the EMI shield. Moreover, such increases in size or layer count of the PCB may increase production costs of such a PCB.

Furthermore, in some examples, a conventional EMI shield may be configured to only encapsulate some electronic components on part of a surface of a PCB while other electronic components are not shielded by the conventional EMI shield. In some such examples, one or more electrically-conductive traces may extend along a surface of the PCB such that the electrically-conductive traces cross a perimeter formed by the EMI shield on the PCB. The conventional EMI shield may include one or more cutouts or slots formed in a sidewall of the EMI shield that allows the electrically-conductive traces to extend beyond the perimeter through the sidewall. However, such cutout(s) or slot(s) may reduce the shielding effectiveness of the EMI shield and thereby lead to a decrease in isolation.

Accordingly, the present description is directed to an electronic assembly including an EMI shield having integrated decoupling, filtering, or matching components that electrically connect between the EMI shield and electrically-conductive traces and/or power planes on a PCB, such that the EMI shield may be electrically connected to the PCB via the decoupling, filtering, or matching components. The decoupling, filtering, or matching components may be configured to filter or match signals or shunt noise from the electrically-conductive traces and/or power planes.

Such an EMI shield may reduce electromagnetic interference on electrically-conductive traces and/or power planes that extend beyond the region of the PCB that is shielded by the EMI shield. Further, such an EMI shield may be electrically connected to a PCB via any suitable exposed conductive material (e.g., copper) on a surface of the PCB. In other words, the EMI shield does not require a PCB to have a continuously exposed perimeter ground plane in order for the EMI shield to be electrically coupled to the PCB. This allows the EMI shield to be used with a wide variety of PCBs having different footprints and surface layouts. Moreover, by eliminating the perimeter ground plane requirement, PCBs that are used with such an EMI shield may have a reduced size and production cost. Furthermore, such an EMI shield optionally may be electrically connected to an existing PCB not originally designed to have an EMI shield, without needing to change the PCB layout.

Figure 1A:
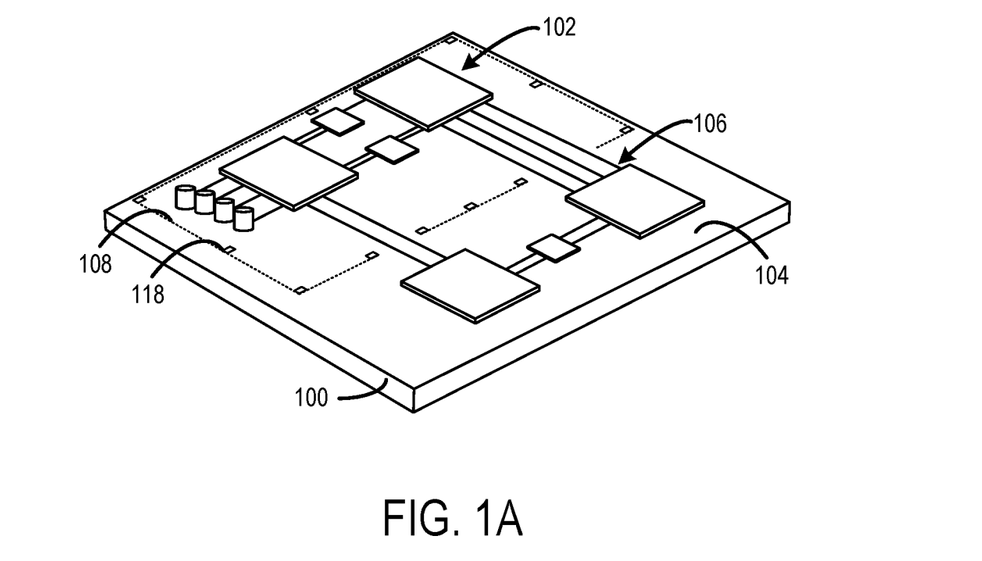
FIG. 1A schematically shows an example printed circuit board (PCB) including a plurality of electronic components and a plurality of electrically-conductive traces.

FIG. 1A schematically shows an example printed circuit board (PCB) 100 including a plurality of electronic components 102 positioned on a surface 104 of the PCB 100. Any suitable type of electronic component may be mounted on the surface 104 of the PCB 100. Non-limiting examples of electronic components that may be mounted on the surface of the PCB 100 include passive circuit components (e.g., capacitors, resistors, inductors), active circuit components (e.g., diodes, transistors), electro-mechanical components, opto-electronic components, display components, audio components, sensor components, radio frequency (RF) components, integrated circuits (ICs), system on chip (SoCs), and electrical power components. In some examples, at least some of the plurality of electronic components 102 may be surface-mount technology (SMT) type components. In some examples, at least some of the plurality of electronic components 102 may be through-hole type components. The plurality of electronic components 102 may be laid out on the surface 104 of the PCB 100 according to any suitable layout design that depends on the purpose of the PCB 100.

A plurality of electrically-conductive traces 106 may extend along the surface 104 of the PCB. The plurality of electrically-conductive traces 106 may be configured to electrically connect the plurality of electronic components 102 to various other electronic components and/or other circuitry (e.g., power, ground) on the PCB 100. The plurality of electrically-conductive traces 106 may be formed of any suitable electrically-conductive material. As one example, the electrically-conductive traces 106 comprise copper. Any suitable number of electrically-conductive traces 106 may be laid out on the surface 104 of the PCB 100 according to any suitable layout design.

The PCB 100 may take any suitable form. More particularly, the PCB 100 may be sized and shaped to accommodate the plurality of electronic components 102 and the plurality of electrically-conductive traces 106. The PCB 100 may include any suitable number of different layers including conductive layers (e.g., ground plane, power plane) and non-conductive/substrate layers (e.g., surface layers, insulating layers). In some implementations, the PCB 100 may include partial or non-continuous layers that occupy only a portion of the total area of the PCB. As one example, a PCB may include a partial ground plane. The PCB may include a partial ground plane in order to reduce a production cost of the PCB, for example.

In order to protect against EMI, an EMI shield may be electrically connected to the PCB 100 to block EM radiation or coupling. In some examples, an electronic component on a PCB may be a source of EM radiation or coupling, and the EMI shield may be configured to encapsulate the electronic component to contain the EM radiation or coupling at the source. In other examples, an electronic component on a PCB may be susceptible to EMI, and the EMI shield may be configured to encapsulate the electronic component to block EM radiation or coupling from reaching the electronic component.

Figure 1B:
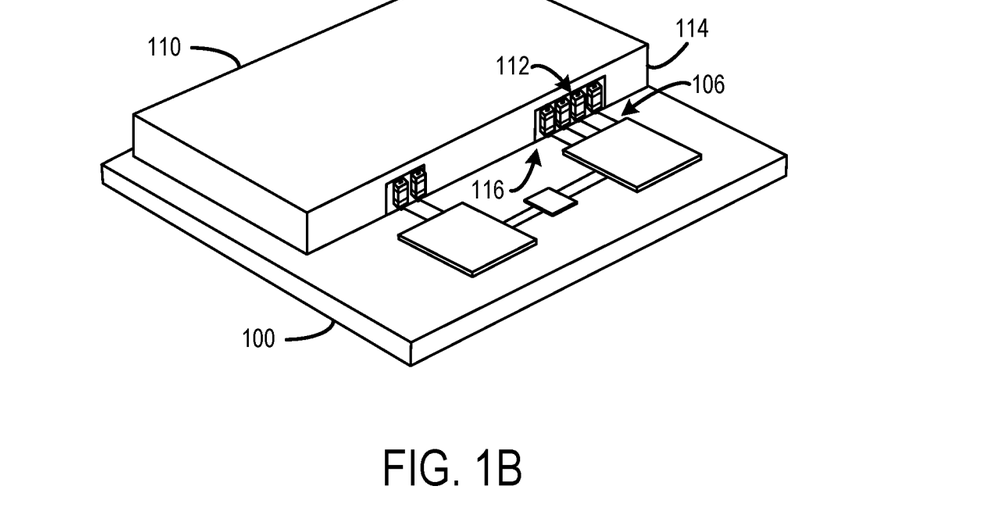
FIG. 1B schematically shows an electromagnetic interference (EMI) shield electrically connected and mechanically affixed to the PCB of FIG. 1A via integrated decoupling, filtering, or matching components.

FIG. 1B schematically shows an EMI shield 110 electrically connected and mechanically affixed to the PCB 100. The EMI shield 110 may comprise any suitable conductive material, such as metal, alloy, or metal-plated plastic or resin. In some examples, the EMI shield may be a heat sink. In some examples, the EMI shield may be a metal chassis or structural component. In the depicted example, the EMI shield 110 is configured to encapsulate and provide shielding for some electronic components on the PCB 100 (i.e., within a perimeter 108 of the EMI shield indicated by dotted lines shown in FIG. 1A). Further, some electronic components on the PCB 100 (i.e., outside of the perimeter 108) are not shielded by the EMI shield 110. In other examples, the EMI shield may provide EMI shielding for all electronic components on the surface of the PCB.

Active electronic components (e.g., transistors, ICs) on the PCB 100 may operate at high frequencies or fast clock signals which can produce noise harmonics or a broadband noise spectrum. Under certain conditions, such as impedance mismatch, proximity, or geometric shape of conductors, electric and magnetic fields can radiate into space or couple to other electronic components. Furthermore, electronic components may be connected to power supplies through the electrically-conductive traces and/or other conductors with finite resistance and inductance. If current drawn by an active electronic component changes, voltage drops from power supply to device will also change due to these impedances. If several active devices share a common path to the power supply, changes in the current drawn by one element may produce voltage changes large enough to affect the operation of others—e.g., voltage spikes or ground bounce—so the change of state of one electronic component may be coupled to others electronic components in the form of signal noise through the common impedance to the power supply.

In some cases, the electronic component may not be generating noise, but there is a need to optimize impedance matching to the component so that signal losses can be minimized. In other cases, no noise may be present, but filtering or conditioning of a signal may be desired, such as a band pass filter, lowpass filter, or diplexer. Specifically, in some such cases, the EMI shield may act as a ground reference for these components, and shielding may be considered a secondary function. In some cases, the decoupling, filtering, or matching component may be used as a DC block.

The EMI shield 110 includes a plurality of integrated decoupling, filtering, or matching components 112 electrically connected between the EMI shield 110 and at least some of the plurality of electrically-conductive traces 106. The decoupling, filtering, or matching components 112 connected to the electrically-conductive traces 106 may help prevent radiation or coupling of electromagnetic interference due to component frequency content or rapidly changing power supply currents. In particular, the decoupling, filtering, or matching component may provide a bypass path for transient currents to flow through a return path instead of allowing the transient current to flow through the common impedance of the electrically-conductive traces 106. The integrated decoupling, filtering, or matching components 112 may serve the dual role of being configured to filter or match signals or shunt noise from the plurality of electrically-conductive traces 106 and provide an electrical and mechanical connection between the EMI shield 110 and the PCB 100. Further, the electrical connection provided by the decoupling, filtering, or matching components may enable the EMI shield to electromagnetically isolate the plurality of electronic components within the perimeter 108 of the EMI shield 110.

The plurality of decoupling, filtering, or matching components 112 may be configured to act as filters for the electrically-conductive traces 106. As one example, a decoupling, filtering, or matching component may be configured to act as a low-pass filter. The plurality of decoupling, filtering, or matching components 112 may be configured to filter any suitable frequency range. In some examples, different decoupling, filtering, or matching components may be configured to filter different frequency ranges depending on the type of connection (e.g., to a trace, ground plane, power plane) and/or other factors. Furthermore, the decoupling, filtering, or matching component optionally may be configured to match the impedance of traces 106.

The plurality of decoupling, filtering, or matching components 112 may be integrated into the EMI shield 110 in any suitable manner. In the depicted example, the EMI shield 110 includes a sidewall 114. The sidewall 114 may form the perimeter 108 of the EMI shield 110 on the PCB 100. The sidewall 114 may have one or more cutouts or slots 116 configured to accommodate one or more decoupling, filtering, or matching components 112. The slot(s) 116 may be sized to minimize a distance between the sidewall 114 and the decoupling, filtering, or matching component(s) in order to maintain the shielding effectiveness of the EMI shield 110 and reduce parasitic inductance. In other words, the decoupling, filtering, or matching components may substantially fill the space of the slot to maintain shielding along the sidewall and reduce parasitic inductance. In another example, the decoupling, filtering, or matching components may be confined within a multi-layer sidewall of the EMI shield.

In some implementations, the EMI shield 110 may contain internal walls or compartments configured to shield particular electronic components or groups of electronic components on the PCB 100. In such implementations, the decoupling, filtering, or matching components may occupy slots in these internal compartment walls in the same manner as on the outer perimeter wall 114 to provide the same function. In some implementations, the EMI shield may include one or more internal dividing walls forming a plurality of different internal shielded compartments for different electronic components within the perimeter of the EMI shield. Each internal shielded compartment may be shielded from each other internal shielded compartment. In some such implementations, one or more internal dividing walls may include a discontinuous, intermittent section and/or may have a single connection point to the EMI shield. Such internal sections may provide directional shielding, reduced coupling, or change the resonances or modes within the cavity in some cases.

Any suitable type of decoupling, filtering, or matching component may be integrated into an EMI shield and electrically connected between the EMI shield and a PCB. For example, a decoupling, filtering, or matching component may include a decoupling capacitor, an inductor, a multi-element filter (e.g., "L," "T," "π" topologies) or another type of filter or signal conditioning component such as a diplexer, circulator, combiner, etc.

In some implementations, the decoupling, filtering, or matching components 112 may be commodity or "off the shelf" components having standardized sizes and dimensions. In one example, the decoupling, filtering, or matching components are surface-mount technology (SMT) components. Such SMT components may be any suitable size and/or package type (e.g., 0402 or 0201). Note that conventional installation of SMT components have a SMT component oriented "horizontally" with all connection points being connected to a single PCB. In contrast, in this arrangement, the SMT components may be oriented "vertically" or "on end" and connected to both the PCB and the EMI shield. By using SMT components in this manner, the electronic assembly may be constructed using commercial manufacturing equipment, such as a pick-and-place machine to electrically connect the SMT components to the EMI shield. In other words, by using commercially available manufacturing equipment, production costs of the EMI shield may be reduced, since the electrical and mechanical characteristics of the component have already been designed, tested, and mass produced. Note that SMT components are one example of a type of decoupling, filtering, or matching component, and other types of decoupling, filtering, or matching components may be used in other examples. Further, other assembly approaches/technologies may be used to produce such an electronic assembly.

The decoupling, filtering, or matching components 112 may be electrically connected and/or mechanically affixed between the EMI shield 110 and the PCB 100 using any suitable conductive material/technology. In one example, the decoupling, filtering, or matching components 112 may be soldered between the EMI shield 110 and the PCB 100. In one particular example, the decoupling, filtering, or matching components 112 may be first soldered to the EMI shield 110 via a high-temperature solder. Then, the decoupling, filtering, or matching components 112 may be soldered to the electrically-conductive traces 106 (and/or another conductor) of the PCB 100 via a reflow solder having a lower melting point than the high-temperature solder. This may allow the entire EMI shield and connected decoupling, filtering, or matching components assembly to be reflowed in an oven to solder it to the PCB without the high-temperature solder melting.

Additionally or alternatively, in some examples, the decoupling, filtering, or matching components may be electrically connected and/or mechanically affixed in a different manner. Such examples may include epoxy, welding, friction or mechanical fit, spring force, and adhesive.

In some examples, the EMI shield 110 optionally may be electrically connected to the PCB 100 via other electrical connections in addition to the decoupling, filtering, or matching components. For example, the EMI shield 110 may be electrically connected to exposed conductors 118 on the surface of the PCB that are along the perimeter 108. Examples of such conductors include a power plane, a ground plane, a via, or another exposed conductor (e.g., piece of copper).

Figure 2:
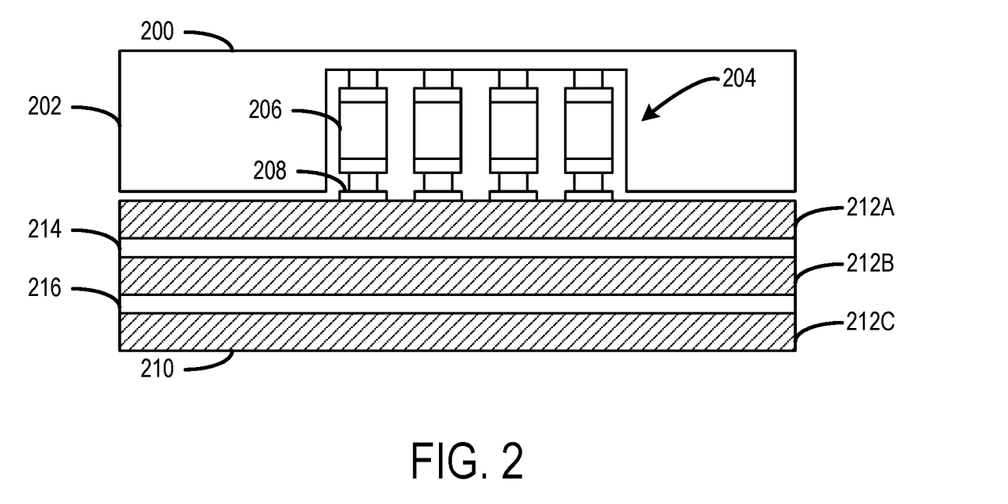
FIG. 2 schematically shows an example implementation where decoupling, filtering, or matching components are electrically connected between an EMI shield and some electrically-conductive traces on a PCB to electrically connect the EMI shield to the PCB.
Figure 3:
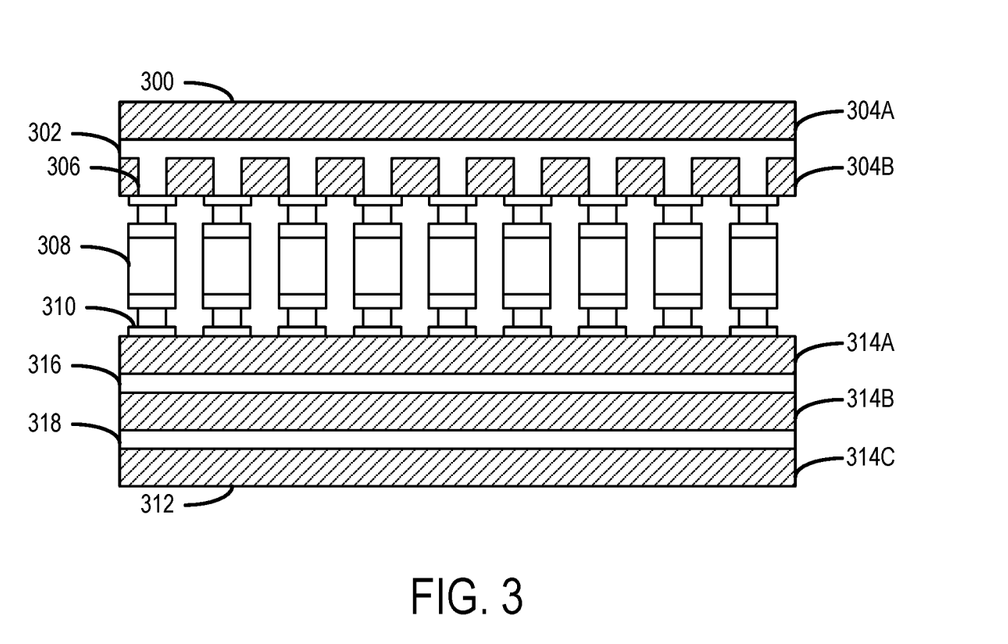
FIG. 3 schematically shows an example implementation where a shielding PCB is electrically connected to a different PCB via decoupling, filtering, or matching components to provide EMI shielding for one or more electronic components of the different PCB.

The EMI shield 110 may take any suitable form that provides EMI shielding for at least some electronic components 102 on the PCB 100. For example, the EMI shield 110 may include conductive material. FIGS. 2 and 3 show aspects of different example EMI shields. In particular, these figures show a partial cross-section view of an electronic assembly in which the EMI shield is electrically connected to a PCB via decoupling, filtering, or matching components. The EMI shield may serve multiple purposes, such as being a heat sink, chassis, or structural component providing mechanical support.

In FIG. 2, an EMI shield 200 is made of stamped metal or alloy. The EMI shield 200 includes a sidewall 202 having a cutout or slot 204 sized to accommodate a plurality of decoupling, filtering, or matching components 206. The plurality of decoupling, filtering, or matching components 206 may collectively substantially fill the space within the slot to maintain the shielding effectiveness of the EMI shield 200. Each decoupling, filtering, or matching component is electrically connected (e.g., soldered) between the sidewall 202 and a corresponding electrically-conductive trace 208 on a surface of a PCB 210. In some examples, the EMI shield 200 may be a single piece of metal. In some examples, the EMI shield 200 may include an assembly of multiple pieces of metal. As one example, the sidewall may be a perimeter fence and the EMI shield may include a metal roof or cover that attaches to the perimeter fence.

The PCB 210 includes a plurality of non-conductive/substrate layers 212 (e.g., upper surface layer 212A, middle layer 212B, lower surface layer 212C). A power plane 214 is positioned between the upper surface layer 212A and the middle layer 212B. A ground plane 216 is positioned between the middle layer 212B and the lower surface layer 212C. In this example, the power plane 214 and the ground plane 216 are not exposed to the portion of the upper surface of the PCB 210 where the EMI shield 200 is positioned. As such, the EMI shield is not electrically connected to either the power plane 214 or the ground plane 216. Instead, the EMI shield is electrically connected to the PCB 210 via the plurality of decoupling, filtering, or matching components 206, as well as potentially zero-ohm resistor or low resistance value resistor components. Such electrical connections between the EMI shield and the PCB allow for design flexibility, since the EMI shield can be electrically connected to the PCB via any suitable exposed conductor (e.g., copper) on the surface of the PCB.

In some examples, the EMI shield 200 may be electrically connected to the PCB 210 at least at some points via other conductors instead of the decoupling, filtering, or matching components. As one example, the sidewall 202 of the EMI shield 200 may be electrically connected directly to exposed conductors on the surface of the PCB 210 to provide additional electrical connections. As another example, SMT components including low resistance grounding resistors may be used to electrically connect the EMI shield 200 to the PCB 210 in some regions to provide additional electrical connections.

In some implementations, the signal trace 208 may pass the EMI shield perimeter as one continuous trace with component 206 as a shunt component. In some other implementations, trace 208 may have a discontinuity at the EMI shield perimeter, such that component 206 acts as a series component in the trace, while also being electrically connected to the EMI shield.

In FIG. 3, an EMI shield 300 is in the form of a shielding PCB. The shielding PCB 300 includes a continuous electrically-conductive layer 302 that is configured to provide EMI shielding for a plurality of electronic components (not shown in FIG. 3, but shown in FIG. 1A) on a different shielded PCB 312. The continuous electrically-conductive layer 302 may extend over the entire area of the shielding PCB 300. The continuous electrically-conductive layer 302 may be sandwiched between two non-conductive/substrate layers 304 (e.g., upper surface layer 304A, lower surface layer 304B). In other examples, the shielding PCB may include additional conductive and/or non-conductive substrate layers. The continuous electrically-conductive layer 302 may be exposed to the surface of the shielding PCB by a plurality of vias 306 that tunnel through the lower surface layer 304B. A plurality of decoupling, filtering, or matching components 308 are electrically connected between the shielding PCB 300 and the shielded PCB 312. Each decoupling, filtering, or matching component 308 is electrically connected (e.g., soldered) between the via 306 (or a solder pad electrically connected to the via) and a corresponding electrically-conductive trace 310 on a surface of the shielded PCB 312. In this example, the continuous electrically-conductive layer 302 in electrical connection with the shielded PCB 312 via the plurality of decoupling, filtering, or matching components 308 provides EMI shielding for at least some electronic components on the surface of the shielded PCB.

The shielded PCB 312 includes a plurality of substrate layers 314 (e.g., upper surface layer 314A, middle layer 314B, lower surface layer 314C). A power plane 316 is positioned between the upper surface layer 314A and the middle layer 314B. A ground plane 318 is positioned between the middle layer 314B and the lower surface layer 314C. In this example, the power plane 316 and the ground plane 318 are not exposed to the portion of the upper surface of the shielded PCB 312 where the shielding PCB 300 is positioned. As such, the shielding PCB is not electrically connected to either the power plane 316 or the ground plane 318. Instead, the shielding PCB 300 is electrically connected to the shielded PCB 312 via the plurality of decoupling, filtering, or matching components 308. Such electrical connections between the shielding PCB and the shielded PCB allow for design flexibility, since the shielding PCB can be electrically connected to the shielded PCB via any suitable exposed conductor (e.g., copper) on the surface of the shielded PCB.

In some implementations, some components may be zero-ohm resistors or low resistance value resistors electrically connecting the shielding PCB to ground plane of a different PCB. In some implementations, additional decoupling, filtering, or matching components may reside entirely on the shielding PCB, and be connected to the decoupling, filtering, or matching components 308. These additional decoupling, filtering, or matching components can be used to provide performance gains and/or additional capability for filtering or matching applications. For example, a multi-pole lumped element filter can be constructed.

In some examples, the decoupling, filtering, or matching components 308 may span the entire perimeter of the shielding PCB 300 to provide a substantially continuous electrical connection between the shielding PCB 300 and the shielded PCB 312. In some examples, the shielding PCB 300 may be electrically connected to the shielded PCB 312 at least at some points via other conductors instead of the decoupling, filtering, or matching components. As one example, stamped pieces of metal may be soldered between the PCBs in some regions. As another example, SMT components including low resistance grounding resistors may be used to electrically connect the PCBs in some regions to provide additional electrical connections.

Figure 4:
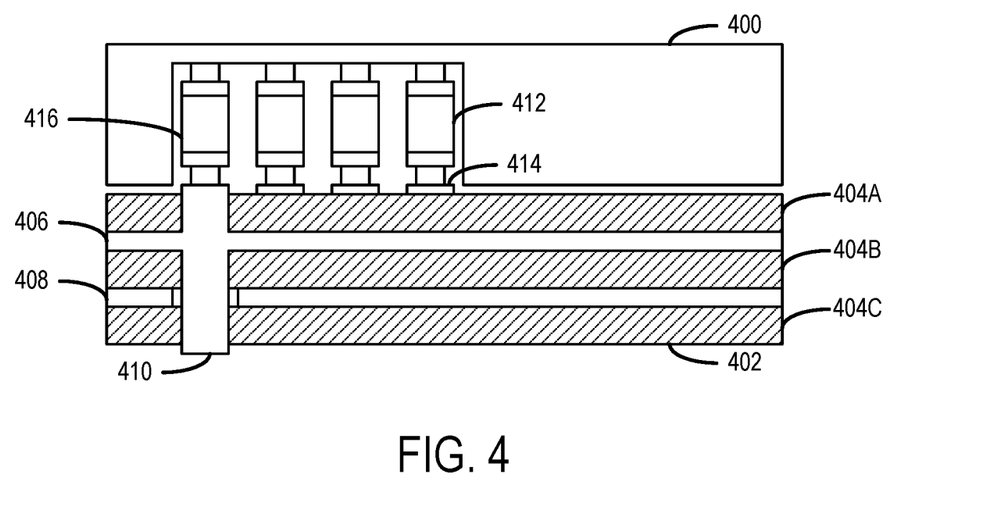
FIG. 4 schematically shows an example implementation where at least one decoupling, filtering, or matching component is electrically connected between an EMI shield and a power plane of a PCB to electrically connect the EMI shield to the PCB.
Figure 5:
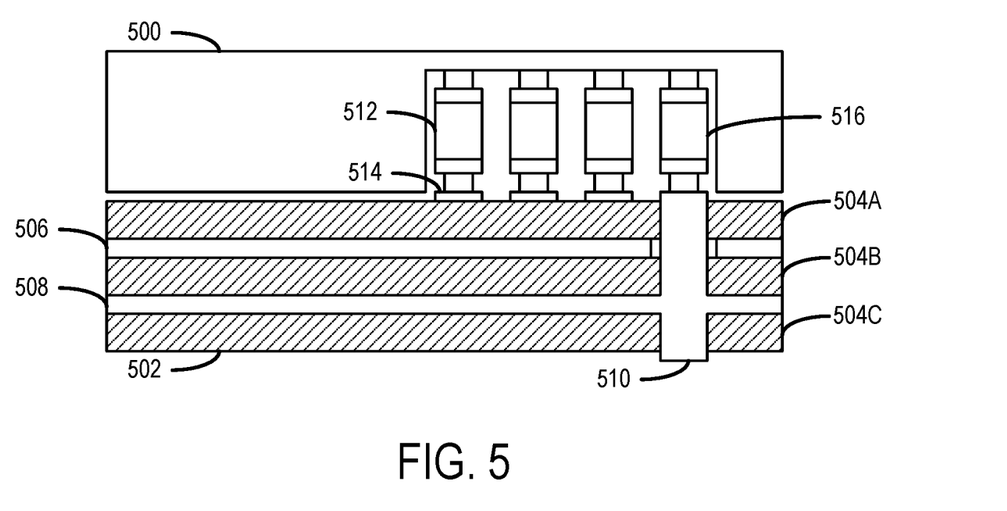
FIG. 5 schematically shows an example implementation where at least one decoupling, filtering, or matching component is electrically connected between an EMI shield and a ground plane of a PCB to electrically connect the EMI shield to the PCB.

In some implementations, an EMI shield may be electrically connected to a PCB via other electrical connections in addition to the decoupling, filtering, or matching components. FIGS. 4 and 5 show aspects of different example electrical connections between an EMI shield and a PCB. In particular, these figures show a partial cross-section view of an electronic assembly in which the EMI shield is electrically connected to a PCB.

In FIG. 4, an EMI shield 400 is electrically connected to a PCB 402 via a plurality of decoupling, filtering, or matching components and other electrical connections. The PCB 402 includes a plurality of non-conductive/substrate layers 404 (e.g., upper surface layer 404A, middle layer 404B, lower surface layer 404C). A power plane 406 is positioned between the upper surface layer 404A and the middle layer 404B. A ground plane 408 is positioned between the middle layer 404B and the lower surface layer 404C. The power plane 406 is exposed to the surface of the PCB 402 through a via 410 that tunnels through the non-conductive layers 404 and the ground plane 408. The via 410 is electrically insulated from the ground plane 408. A first decoupling, filtering, or matching component 412 is electrically connected between the EMI shield 400 and an electrically-conductive trace 414 on a surface of the PCB 402. Another electrically-conductive component 416 is electrically connected between the EMI shield 400 and the power plane 406 by way of electrically connecting to the via 410. In the depicted example, the electrically-conductive component 416 is a decoupling, filtering, or matching component. In other examples, the electrically-conductive component may be an SMT component or another conductor (e.g., a piece of stamped metal).

In some implementations, there may be no EMI shield wall or EMI shield fence, and instead the perimeter may be composed of decoupling, filtering, or matching components around the entire perimeter, which may connect to power planes or signal traces. In some implementations, zero-ohm resistors or low resistance value resistors can be used to connect the EMI shield to ground instead of using an EMI shield wall or fence.

In FIG. 5, an EMI shield 500 is electrically connected to a PCB 502 via a plurality of decoupling, filtering, or matching components and other electrical connections. The PCB 502 includes a plurality of non-conductive/substrate layers 504 (e.g., upper surface layer 504A, middle layer 504B, lower surface layer 504C). A power plane 506 is positioned between the upper surface layer 504A and the middle layer 504B. A ground plane 508 is positioned between the middle layer 504B and the lower surface layer 504C. The ground plane 508 is exposed to the surface of the PCB 502 through a via 510 that tunnels through the non-conductive layers 504 and the power plane 506. The via 510 is electrically insulated from the power plane 506. A first decoupling, filtering, or matching component 512 is electrically connected between the EMI shield 500 and an electrically-conductive trace 514 on a surface of the PCB 502. Another electrically-conductive component 516 is electrically connected between the EMI shield 500 and the ground plane 508 by way of electrically connecting to the via 510. In the depicted example, the electrically-conductive component 516 is a decoupling, filtering, or matching component. In other examples, the electrically-conductive component may be an SMT component or another conductor (e.g., a piece of stamped metal). In some examples, one or more of the components may be a zero-ohm resistor or low resistance value resistor.

It will be appreciated that the herein described EMI shield may be electrically connected to a PCB via any suitable conductor on a surface of the PCB. This facilities significant flexibility in the design of such an EMI shield and/or a PCB. For example, a power plane and/or a ground plane of a PCB may not extend under the entire perimeter of the EMI shield and/or may not be exposed to a surface of the PCB in some areas under the EMI shield, due to the electrical connection flexibility, the EMI shield may be have a combination of different electrical connections to electrically-conductive traces, the power plane, and/or the ground plane at differ points around the perimeter of the EMI shield as dictated by the surface layout of the PCB.

Figure 6:
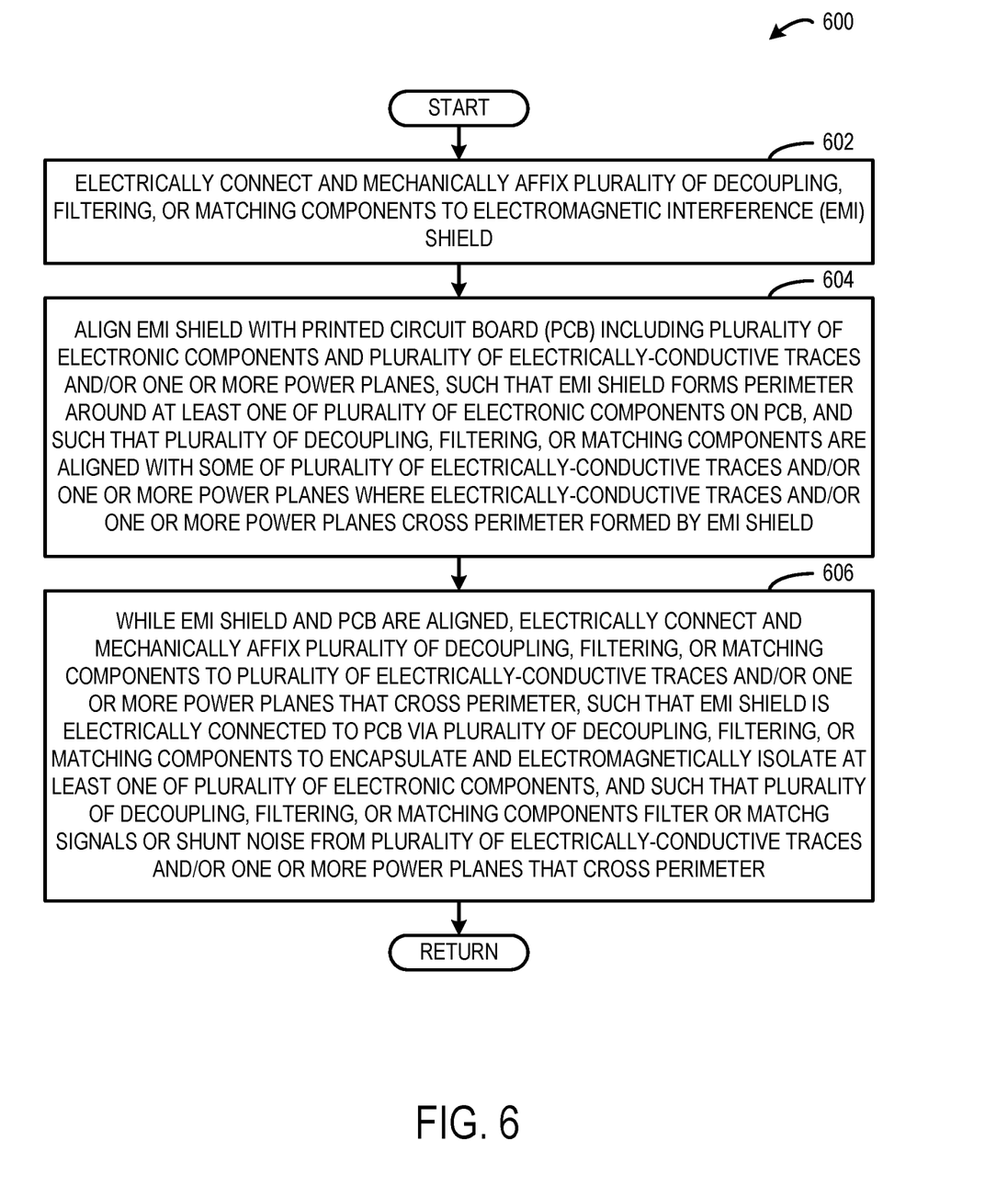
FIG. 6 is a flowchart depicting aspects of an example method for production an electronic assembly.

FIG. 6 shows aspects of an example method 600 for producing an electronic assembly as described herein. At 602, the method 600 includes electrically connecting and mechanically affixing a plurality of decoupling, filtering, or matching components to an EMI shield. In some implementations where the EMI shield is made of stamped metal, the method step may include forming one or more slots or cutouts in a sidewall of the EMI shield to accommodate the decoupling, filtering, or matching components. In other implementations, the EMI shield may include a shielding PCB. In some implementations, the method optionally may include placing solder or another connection material on the EMI shield (e.g., in the slot(s)), using a pick-and-place machine to place SMT components vertically such that one end contacts the connection material (e.g., place the SMT components in the slot(s)), and re-flowing the EMI shield and the plurality of decoupling, filtering, or matching components in an oven to electrically connect and mechanically affix the plurality of decoupling, filtering, or matching components to the EMI shield.

At 604, the method 600 includes aligning the EMI shield with a PCB including a plurality of electronic components and a plurality of electrically-conductive traces and/or power planes, such that the EMI shield forms a perimeter around at least one of the plurality of electronic components on the PCB, and such that the plurality of decoupling, filtering, or matching components are aligned with some of the plurality of electrically-conductive traces and/or power planes where those electrically-conductive traces and/or power planes cross the perimeter formed by the EMI shield. In some examples, this method step optionally may be performed by a pick-and-place machine.

At 606, the method 600 includes while the EMI shield and the PCB are aligned, electrically connecting and mechanically affixing the plurality of decoupling, filtering, or matching components to the plurality of electrically-conductive traces and/or power planes that cross the perimeter, such that the EMI shield is electrically connected to the PCB via the plurality of decoupling, filtering, or matching components In some implementations, the decoupling, filtering, or matching components may be first soldered to the EMI shield via a high-temperature solder. Then, the decoupling, filtering, or matching components may be soldered to the electrically-conductive traces and/or power planes of the PCB via a reflow solder having a lower melting point than the high-temperature solder. This may allow the entire EMI shield and connected decoupling, filtering, or matching components assembly to be reflowed in an oven to solder it to the PCB without the high-temperature solder melting.

The resulting electronic assembly enables the EMI shield to encapsulate and electromagnetically isolate at least one of the plurality of electronic components on the PCB. Further, the resulting electronic assembly enables the plurality of decoupling, filtering, or matching components to filter or match signals or shunt noise from the plurality of electrically-conductive traces and/or power planes that cross the perimeter formed by the EMI shield.

In an example, an electronic assembly, comprises a printed circuit board (PCB) including a plurality of electronic components and a plurality of electrically-conductive traces, and an electromagnetic interference (EMI) shield sized and shaped to form a perimeter around at least one of the plurality of electronic components on the PCB, where the plurality of electrically-conductive traces cross the perimeter formed by the EMI shield, where the EMI shield includes a plurality of decoupling, filtering, or matching components electrically connected between the EMI shield and the plurality of electrically-conductive traces such that the plurality of decoupling, filtering, or matching components are configured to filter or match signals or shunt noise from the plurality of electrically-conductive traces, and where the EMI shield is electrically connected to the PCB via the plurality of decoupling, filtering, or matching components to encapsulate and electromagnetically isolate the plurality of electronic components. In this example and/or other examples, at least one decoupling, filtering, or matching component may be configured to shunt or filter noise, to filter or condition signals, or match impedances. In this example and/or other examples, the EMI shield may include one or more internal dividing walls forming a plurality of different internal shielded compartments for different electronic components within the perimeter, and each internal shielded compartment may be shielded from each other internal shielded compartment. In this example and/or other examples, the one or more internal dividing walls may include a discontinuous, intermittent section and/or have a single connection point to the EMI shield. In this example and/or other examples, at least one decoupling, filtering, or matching component may be at least one of a shunt capacitor, an inductor, or a multi-element filter. In this example and/or other examples, at least one decoupling, filtering, or matching component may be a commodity surface-mountable electronic component having a standardized size. In this example and/or other examples, the PCB may include a ground plane, and the EMI shield may be electrically connected to the ground plane. In this example and/or other examples, some or all of the grounding of the EMI shield may be made through a commodity surface-mountable zero-ohm resistor or low resistance value resistor component having a standardized size. In this example and/or other examples, the PCB may include a power plane, and the EMI shield may be electrically connected to the power plane through at least one or more additional decoupling, filtering, or matching components. In this example and/or other examples, the EMI shield may include a sidewall or detachable shield fence having at least one slot, and at least one of the plurality of decoupling, filtering, or matching components may be positioned in the at least one slot in the sidewall. In this example and/or other examples, the EMI shield may be a shielding PCB including a continuous electrically-conductive layer that may be configured to provide EMI shielding for the plurality of electronic components. In this example and/or other examples, the plurality of decoupling, filtering, or matching components may be electrically connected to the PCB via a reflow solder, and the plurality of decoupling, filtering, or matching components may be electrically connected to the EMI shield via a high-temperature solder having a higher melting point than the reflow solder.

In an example, a method of manufacturing an electronic assembly comprises electrically connecting and mechanically affixing a plurality of decoupling, filtering, or matching components to an electromagnetic interference (EMI) shield, aligning the EMI shield with a printed circuit board (PCB) including a plurality of electronic components and a plurality of electrically-conductive traces, such that the EMI shield forms a perimeter around at least one of the plurality of electronic components on the PCB, and such that the plurality of decoupling, filtering, or matching components are aligned with some of the plurality of electrically-conductive traces where those electrically-conductive traces cross the perimeter formed by the EMI shield, and while the EMI shield and the PCB are aligned, electrically connecting and mechanically affixing the plurality of decoupling, filtering, or matching components to the plurality of electrically-conductive traces that cross the perimeter, such that the EMI shield is electrically connected to the PCB via the plurality of decoupling, filtering, or matching components to encapsulate and electromagnetically isolate the at least one of the plurality of electronic components, and such that the plurality of decoupling, filtering, or matching components filter or match signals or shunt noise from the plurality of electrically-conductive traces that cross the perimeter. In this example and/or other examples, the plurality of decoupling, filtering, or matching components may be commodity surface-mountable electronic components having a standardized size, and the plurality of decoupling, filtering, or matching components may be electrically connected and mechanically affixed the to the EMI shield using a pick-and-place machine. In this example and/or other examples, the plurality of decoupling, filtering, or matching components may be electrically connected and mechanically affixed to the PCB via a reflow solder. In this example and/or other examples, the plurality of decoupling, filtering, or matching components may be electrically connected and mechanically affixed to the EMI shield via a high-temperature solder having a higher melting point than the reflow solder. In this example and/or other examples, the plurality of decoupling, filtering, or matching components may be electrically connected and mechanically affixed to the EMI shield via at least one of electrically-conductive epoxy, mechanical crimping or spring force, or welding. In this example and/or other examples, the EMI shield may include a sidewall or detachable shield fence, and the method may further comprise forming at least one slot in the sidewall or shield fence, where at least one of the plurality of decoupling, filtering, or matching components is electrically connected and mechanically affixed in the at least one slot formed in the sidewall or shield fence. In this example and/or other examples, the EMI shield may be a shielding PCB including a continuous electrically-conductive layer that is configured to provide EMI shielding for the plurality of electronic components.

In an example, an electronic assembly comprises a printed circuit board (PCB) including a plurality of electrically-conductive traces and one or more power planes, and an electromagnetic interference (EMI) shield including a plurality of decoupling, filtering, or matching components electrically connected between the EMI shield and the plurality of electrically-conductive traces and/or the one or more power planes such that the plurality of decoupling, filtering, or matching components are configured to filter or match signals or shunt noise from the plurality of electrically-conductive traces and/or the one or more power planes.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:
1. An electronic assembly, comprising:
a printed circuit board (PCB) including a plurality of electronic components and a plurality of electrically-conductive traces; and
an electromagnetic interference (EMI) shield sized and shaped to form a perimeter around at least one of the plurality of electronic components on the PCB, where the plurality of electrically-conductive traces cross the perimeter formed by the EMI shield, where the EMI shield includes a plurality of decoupling, filtering, or matching components electrically connected between the EMI shield and the plurality of electrically-conductive traces such that the plurality of decoupling, filtering, or matching components are configured to filter or match signals or shunt noise from the plurality of electrically-conductive traces, and where the EMI shield is electrically connected to the PCB via the plurality of decoupling, filtering, or matching components to encapsulate and electromagnetically isolate the plurality of electronic components.

2. The electronic assembly of claim 1, where at least one decoupling, filtering, or matching component is configured to shunt or filter noise, to filter or condition signals, or match impedances.

3. The electronic assembly of claim 1, where the EMI shield includes one or more internal dividing walls forming a plurality of different internal shielded compartments for different electronic components within the perimeter, and where each internal shielded compartment is shielded from each other internal shielded compartment.

4. The electronic assembly of claim 3, where the one or more internal dividing walls include a discontinuous, intermittent section and/or have a single connection point to the EMI shield.

5. The electronic assembly of claim 1, where at least one decoupling, filtering, or matching component is at least one of a shunt capacitor, an inductor, or a multi-element filter.

6. The electronic assembly of claim 1, where at least one decoupling, filtering, or matching component is a commodity surface-mountable electronic component having a standardized size.

7. The electronic assembly of claim 1, where the PCB includes a ground plane, and where the EMI shield is electrically connected to the ground plane.

8. The electronic assembly of claim 7, where some or all of the grounding of the EMI shield is made through a commodity surface-mountable zero-ohm resistor or low resistance value resistor component having a standardized size.

9. The electronic assembly of claim 1, where the PCB includes a power plane, and where the EMI shield is electrically connected to the power plane through at least one or more additional decoupling, filtering, or matching components.

10. The electronic assembly of claim 1, where the EMI shield includes a sidewall or detachable shield fence having at least one slot, and where at least one of the plurality of decoupling, filtering, or matching components is positioned in the at least one slot in the sidewall.

11. The electronic assembly of claim 1, where the EMI shield is a shielding PCB including a continuous electrically-conductive layer that is configured to provide EMI shielding for the plurality of electronic components.

12. The electronic assembly of claim 1, where the plurality of decoupling, filtering, or matching components are electrically connected to the PCB via a reflow solder, and where the plurality of decoupling, filtering, or matching components are electrically connected to the EMI shield via a high-temperature solder having a higher melting point than the reflow solder.

13. A method of manufacturing an electronic assembly, the method comprising:
electrically connecting and mechanically affixing a plurality of decoupling, filtering, or matching components to an electromagnetic interference (EMI) shield;
aligning the EMI shield with a printed circuit board (PCB) including a plurality of electronic components and a plurality of electrically-conductive traces, such that the EMI shield forms a perimeter around at least one of the plurality of electronic components on the PCB, and such that the plurality of decoupling, filtering, or matching components are aligned with some of the plurality of electrically-conductive traces where those electrically-conductive traces cross the perimeter formed by the EMI shield; and
while the EMI shield and the PCB are aligned, electrically connecting and mechanically affixing the plurality of decoupling, filtering, or matching components to the plurality of electrically-conductive traces that cross the perimeter, such that the EMI shield is electrically connected to the PCB via the plurality of decoupling, filtering, or matching components to encapsulate and electromagnetically isolate the at least one of the plurality of electronic components, and such that the plurality of decoupling, filtering, or matching components filter or match signals or shunt noise from the plurality of electrically-conductive traces that cross the perimeter.

14. The method of claim 13, where the plurality of decoupling, filtering, or matching components are commodity surface-mountable electronic components having a standardized size, and where the plurality of decoupling, filtering, or matching components are electrically connected and mechanically affixed the to the EMI shield using a pick-and-place machine.

15. The method of claim 13, where the plurality of decoupling, filtering, or matching components are electrically connected and mechanically affixed to the PCB via a reflow solder.

16. The method of claim 15, where the plurality of decoupling, filtering, or matching components are electrically connected and mechanically affixed to the EMI shield via a high-temperature solder having a higher melting point than the reflow solder.

17. The method of claim 13, where the plurality of decoupling, filtering, or matching components are electrically connected and mechanically affixed to the EMI shield via at least one of electrically-conductive epoxy, mechanical crimping or spring force, or welding.

18. The method of claim 13, where the EMI shield includes a sidewall or detachable shield fence, and where the method further comprises forming at least one slot in the sidewall or shield fence, where at least one of the plurality of decoupling, filtering, or matching components is electrically connected and mechanically affixed in the at least one slot formed in the sidewall or shield fence.

19. The method of claim 13, where the EMI shield is a shielding PCB including a continuous electrically-conductive layer that is configured to provide EMI shielding for the plurality of electronic components.

20. An electronic assembly, comprising:
a printed circuit board (PCB) including a plurality of electrically-conductive traces and one or more power planes; and
an electromagnetic interference (EMI) shield including a plurality of decoupling, filtering, or matching components electrically connected between the EMI shield and the plurality of electrically-conductive traces or the EMI shield and the one or more power planes such that the plurality of electrically-conductive traces and the one or more power planes are positioned between the PCB and the plurality of decoupling, filtering, or matching components where the plurality of electrically-conductive traces and the one or more power planes cross under the EMI shield, and wherein the plurality of decoupling, filtering, or matching components are configured to filter or match signals or shunt noise from the plurality of electrically-conductive traces and/or the one or more power planes.

* * * * *